(12) United States Patent
Sung et al.

(10) Patent No.: US 11,616,130 B2
(45) Date of Patent: Mar. 28, 2023

(54) TRANSISTOR DEVICE WITH VARIOUSLY CONFORMAL GATE DIELECTRIC LAYERS

(71) Applicant: Intel Corporation, Santa Clara, CA (US)

(72) Inventors: Seung Hoon Sung, Portland, OR (US); Jack Kavalieros, Portland, OR (US); Ian Young, Portland, OR (US); Matthew Metz, Portland, OR (US); Uygar Avci, Portland, OR (US); Devin Merrill, McMinnville, OR (US); Ashish Verma Penumatcha, Hillsboro, OR (US); Chia-Ching Lin, Portland, OR (US); Owen Loh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 775 days.

(21) Appl. No.: 16/363,632

(22) Filed: Mar. 25, 2019

(65) Prior Publication Data

US 2020/0312976 A1    Oct. 1, 2020

(51) Int. Cl.
*H01L 29/49* (2006.01)
*H01L 29/51* (2006.01)
(Continued)

(52) U.S. Cl.
CPC .... *H01L 29/4983* (2013.01); *H01L 21/28132* (2013.01); *H01L 29/517* (2013.01); *H01L 29/6656* (2013.01); *H01L 29/66545* (2013.01); *H01L 29/66795* (2013.01); *H01L 29/7851* (2013.01)

(58) Field of Classification Search
CPC ........... H01L 29/4983; H01L 21/28132; H01L 29/517; H01L 29/66545; H01L 29/6656; H01L 29/66795; H01L 29/7851
See application file for complete search history.

(56) References Cited

U.S. PATENT DOCUMENTS

| 2010/0200916 A1* | 8/2010 | Gossner | ................ | H01L 29/165 |
|---|---|---|---|---|
| | | | | 257/335 |
| 2017/0040439 A1* | 2/2017 | Chang | ............... | H01L 29/66795 |

(Continued)

*Primary Examiner* — Monica D Harrison
*Assistant Examiner* — Andre C Stevenson
(74) *Attorney, Agent, or Firm* — Essential Patents Group, LLP

(57) ABSTRACT

Techniques and mechanisms to provide electrical insulation between a gate and a channel region of a non-planar circuit device. In an embodiment, the gate structure, and insulation spacers at opposite respective sides of the gate structure, each extend over a semiconductor fin structure. In a region between the insulation spacers, a first dielectric layer extends conformally over the fin, and a second dielectric layer adjoins and extends conformally over the first dielectric layer. A third dielectric layer, adjoining the second dielectric layer and the insulation spacers, extends under the gate structure. Of the first, second and third dielectric layers, the third dielectric layer is conformal to respective sidewalls of the insulation spacers. In another embodiment, the second dielectric layer is of dielectric constant which is greater than that of the first dielectric layer, and equal to or less than that of the third dielectric layer.

20 Claims, 10 Drawing Sheets

(51) Int. Cl.
    *H01L 29/78*     (2006.01)
    *H01L 29/66*     (2006.01)
    *H01L 21/28*     (2006.01)

(56) References Cited

U.S. PATENT DOCUMENTS

| | | | |
|---|---|---|---|
| 2017/0084461 A1* | 3/2017 | Colinge | H01L 21/311 |
| 2017/0084714 A1* | 3/2017 | Ching | H01L 29/66795 |
| 2017/0365522 A1* | 12/2017 | Jeong | H01L 21/823878 |
| 2020/0135572 A1* | 4/2020 | Chung | H01L 29/513 |
| 2021/0074828 A1* | 3/2021 | Rachmady | H01L 29/66636 |

* cited by examiner 403   403a   403b 404   404a   404b 405   405a   405b

TRANSISTOR DEVICE WITH VARIOUSLY CONFORMAL GATE DIELECTRIC LAYERS

BACKGROUND

1. Technical Field

Embodiments of the invention relate generally to non-planar semiconductor devices that provide electrical insulation of a gate structure. Methods of manufacturing such devices are also described.

2. Background Art

A FinFET is one type of non-planar transistor which is built around a thin strip of semiconductor material (referred to as the "fin"). The transistor includes the standard field effect transistor (FET) nodes/components: a gate, a gate dielectric, a source region, and a drain region. During operation, a conductive channel of the device resides on the outer sides of the fin beneath the gate dielectric. Specifically, current runs along "sidewalls" of the fin as well as along the top side of the fin. Because the conductive channel essentially resides along the three different outer, planar regions of the fin, such a FinFET is typically referred to as a "tri-gate" FinFET. Other types of FinFETs exist (such as "double-gate" FinFETs in which the conductive channel principally resides only along both sidewalls of the fin and not along the top side of the fin).

Typically, fabricating a non-planar transistor includes depositing a dielectric material into a given space to form, at least in part, a structure (such as a gate dielectric) that, eventually, is to provide at least some electrical insulation between two adjoining structures. However, such deposition is increasingly challenging as improvements to semiconductor fabrication processing continue to reduce the size of transistor structures. As a result, there is expected to be a growing premium placed on incremental improvements to techniques for providing electrical insulation across a boundary of a non-planar transistor, where the boundary is very constrained along one or more dimensions.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
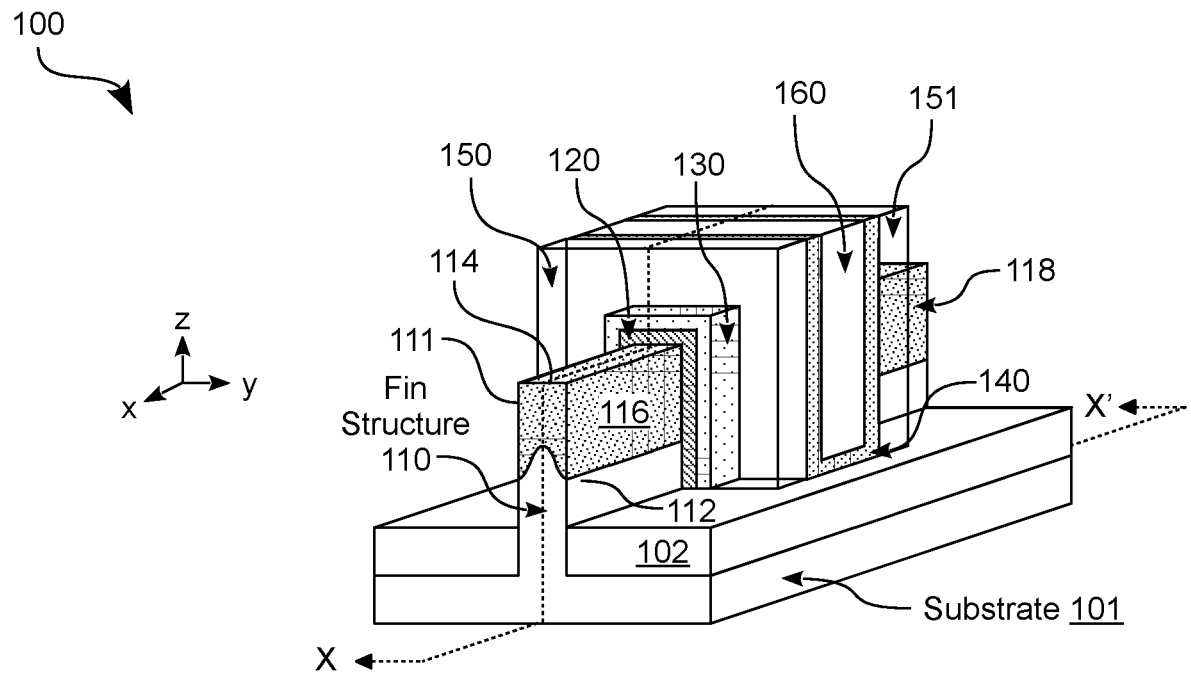
FIG. 1 shows a perspective view of an integrated circuit including multiple gate dielectric structures according to an embodiment.
Figure 1:
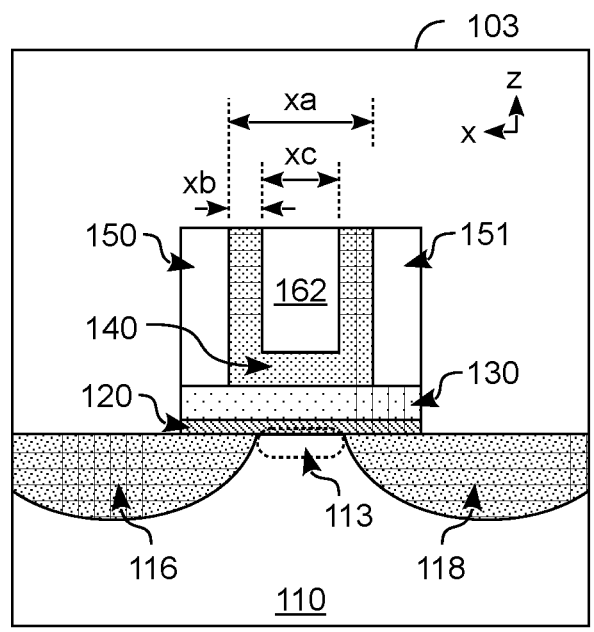

Embodiments discussed herein variously provide techniques and mechanisms to facilitate electrical insulation between a gate structure and a channel region of a non-planar integrated circuit (IC) device. In various embodiments, the gate structure, and spacer structures formed at opposite respective sides of the gate structure, variously extend along and over a fin structure which comprises a semiconductor material. In a region between the spacer structures, a first layer of a first dielectric material extends conformally over the fin structure. Also in the region between the spacer structures, a second layer of a second dielectric material extends conformally over an adjoining portion of the first layer. In some embodiments, the second dielectric material is of a dielectric constant which is greater than that of the first dielectric material. The second layer is disposed between the first layer and a third layer of a third dielectric material—e.g., wherein the third layer extends under the gate structure and further extends conformally along adjoining sidewall portions of the spacer structures. By providing the second layer between the first layer and the third layer, some embodiments variously promote electrical insulation of a channel region without risking errors in the fabrication of a gate electrode over the channel region.

Certain features of various embodiments are described herein with reference to various layer structures which each have a respective average thickness. In this context, the term "average thickness" refers to an average of thicknesses of a particular layer, where the thicknesses are each at a respective location along a given surface region along which the layer extends. An average thickness is, for example, an average of minimum thicknesses each at a respective location of the surface region—e.g., wherein the thickness is measured in a direction which is orthogonal to the surface region at that location.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including one or more non-planar IC devices.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single transistor.

It is pointed out that those elements of the figures having the same reference numbers (or names) as the elements of any other figure can operate or function in any manner similar to that described, but are not limited to such.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate (e.g., FinFET) transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors-BJT PNP/NPN, BiCMOS, CMOS, etc., may be used for some transistors without departing from the scope of the disclosure.

FIG. 1 is a perspective view of an integrated circuit (IC) device 100, according to an embodiment, which comprises a non-planar semiconductor device including at least one gate formed on at least one fin structure. IC device 100 is one example of an embodiment wherein structures of a transistor, diode or other such device are variously disposed in or on a fin structure. Although structures of IC device 100 are variously shown as having respective rectilinear geometries, in various embodiments some or all such structures—including structures of the non-planar geometries—instead have curved, obliquely angled, tapered and/or otherwise non-rectilinear shapes.

FIG. 1 shows one example of a portion of an IC device 100 consistent with the present disclosure, in this case a portion of a FinFET. As shown, IC device 100 includes a substrate 101, a trench dielectric 102 on substrate 101, and a fin structure 110 disposed in a trench which is formed by trench dielectric 102. Fin structure 110 comprises, for example, a top surface 114 and a pair of laterally opposite sidewalls (sidewall 111 and opposing sidewall 112, respectively). In some embodiments, portions of fin structure 110 which are vertically offset from one another comprise different respective III-V (and/or other) semiconductor materials.

Substrate 101 is formed of any of a variety of materials that are suitable for use as a substrate of a semiconductor device, and in particular as a substrate for non-planar transistors such as FinFETS and multi-gate transistors. Non-limiting examples of such suitable materials include silicon (Si), germanium (Ge), silicon-germanium (SiGe), silicon-carbide (SiC), sapphire, a III-V semiconductor, a silicon on insulate (all) substrate, combinations thereof, and the like. Without limitation, in some embodiments substrate 101 is formed from or includes single crystal silicon.

In some embodiments, one or more underlayers (not illustrated) are deposited on substrate 101, e.g., such that they are present between substrate 101 and one or more of trench dielectric 102 and the materials forming fin structure 110. For example, one or more semiconductor base layers are deposited on substrate 101, in some embodiments. When used, such base layers may be pseudomorphic, metamorphic, or substantially lattice matched buffer and/or transition layers, as understood in the art. In any case, substrate 101 is thus able to provide an epitaxial seeding surface (e.g., a crystalline surface having a (100) or other suitable orientation) for the subsequent deposition of the materials of fin structure 110.

In the embodiment of IC device 100, a trench (not separately labeled) is defined by the sidewalls of trench dielectric 102 (hereinafter, trench sidewalls) and an upper portion of substrate 101. A trench of any of a variety of suitable dimensions may be used, in different embodiments, according to implementation-specific details. Without limitation, in some embodiments the height (z-axis dimension) and width (y-axis dimension) of the trench enables the deposition of the materials used to form fin structure 110—e.g., via an aspect ratio trapping (ART) process. Accordingly, in some embodiments the width of the trench is in a range of 1 nanometers (nm) to 500 nanometers (nm), such as in a range of 1 nm to 300 nm, in a range of 1 nm to 100 nm, in a range of 5 nm to 100 nm, or even in a range of 5 nm to 30 nm. Likewise, the height of such a trench is range, for example, in a range of 1 nm to 500 nm, such as a range of 100 nm to 300 nm.

Trench dielectric 102 is formed from any of a variety of materials that are suitable for use as a trench dielectric material of a non-planar semiconductor device. Non-limiting examples of such materials include oxides, nitrides and alloys, such as but not limited to silicon oxide ($SiO_2$), silicon nitride (SiN), silicon oxycarbide (SiCO), silicon carbon oxynitride (SiCON), silicon carbonitride (SiCN), combinations thereof, and the like. Without limitation, in some embodiments trench dielectric 102 is $SiO_2$. In more general terms, in some embodiments the non-planar semiconductor device includes a substrate and at least one trench that is formed on or within the substrate. Such a trench is defined by at least two opposing sides (trench sidewalls) and a bottom. A bottom of the trench is formed at least in part by an upper surface of the substrate, and/or one or more buffer and/or transition layers deposited on the substrate.

A non-planar transistor of IC device 100 comprises structures which are variously disposed in or on fin structure 110. For example, such a non-planar transistor may include a channel structure 113 and two source or drain ("SD") structures 116, 118 at opposite ends thereof—e.g., wherein fin structure 110 includes each of doped SD structures 116, 118 and channel structure 113.

A gate structure of the non-planar transistor (e.g., including the illustrative gate dielectrics 120, 130, 140 and gate electrode 162 shown) may extend over the channel structure—e.g., wherein gate dielectrics 120, 130, 140 provide electrical insulation between gate electrode 162 and each of a top of the channel structure and opposite vertical sidewalls of the channel structure.

An inset 103 in FIG. 1 shows a view of a cross-section X-X' of IC device 100. As illustrated in inset 103, a gate electrode 160 extends over and across a portion of fin 110 in a region between insulation spacers 150, 151 (which are represented as transparent to further show features of IC device 100). In some advantageous embodiments, gate electrode 160 includes a metal with a work function below 5 eV. The metal gate electrode 160 includes, for example, an elemental metal layer, a metal alloy layer, or laminate structure of either or both. In some embodiments the gate electrode 160 is a metal nitride, such as TiN (e.g., 4.0-4.7 eV). The gate electrode 160 may also comprise Al (e.g., TiAlN). Other alloy constituents may also be employed, such as, but not limited to C, Ta, W, Pt, and Zn.

In an embodiment, operation of IC device 100 includes selectively controlling a current—between source or drain regions 116, 118 via channel region 113—by applying a voltage to gate electrode 160. This functionality is enabled in part by dielectric structures which provide electrical insulation between gate 160 and channel region 113.

In the example embodiment shown, such dielectric structures comprise a layer 120 which adjoins, and is conformal to, respective portions of sidewalls 111, 112 and top surface 114. The dielectric structures further comprise another layer 140, portions of which variously extend each between gate electrode 160 and a respective one of layer 120, insulation spacer 150, or insulation spacer 151. It is noted that layer 120 is not conformal to the sides of insulation spacer 150, 151.

As further shown in inset 103, spacers 150, 151 are separated from one another by a distance xa along the x-axis shown. Layer 140 conforms to various side surfaces defining the area between spacers 150, 151—e.g., wherein layer 140 has the average thickness xb shown. As a result, along the x-axis dimension, a width xc is available to accommodate deposition of gate electrode 160 (e.g., where xc≈xa−2xb). As successive generations of integrated circuit technology continue to scale to smaller dimensions, while deposition thicknesses approach lower limits, there is a trend (for example) for this available width xc to decrease. As a result, it is expected to be increasingly difficult to satisfactorily form gate electrode structures without sacrificing insulation between such a gate electrode and an underlying channel region. Some embodiments mitigate this problem by providing an additional layer 130 which, like layer 120, extends over and across fin structure 110 in a region between insulation spacer 150, 151. In such a region, layer 130 adjoins, and is conformal to, layer 120—e.g., wherein a layer 130 is of a dielectric constant which is greater than that of layer 120. Generally, the use of higher dielectric constant (k) materials as gate dielectrics tends to result in increased channel region scattering. Such scattering reduced channel mobility, which in turn contributes to degradation of transistor performance. To mitigate this problem, some embodiments variously provide an underlying gate dielectric which is of a relatively low-k, as compared to additional dielectric layers which are variously disposed thereon. Of the dielectric layers 120, 130, 140, the dielectric layer 140 (e.g., only dielectric layer 140) extends conformally along respective sidewall structures of spacers 150, 151.

Figure 2:
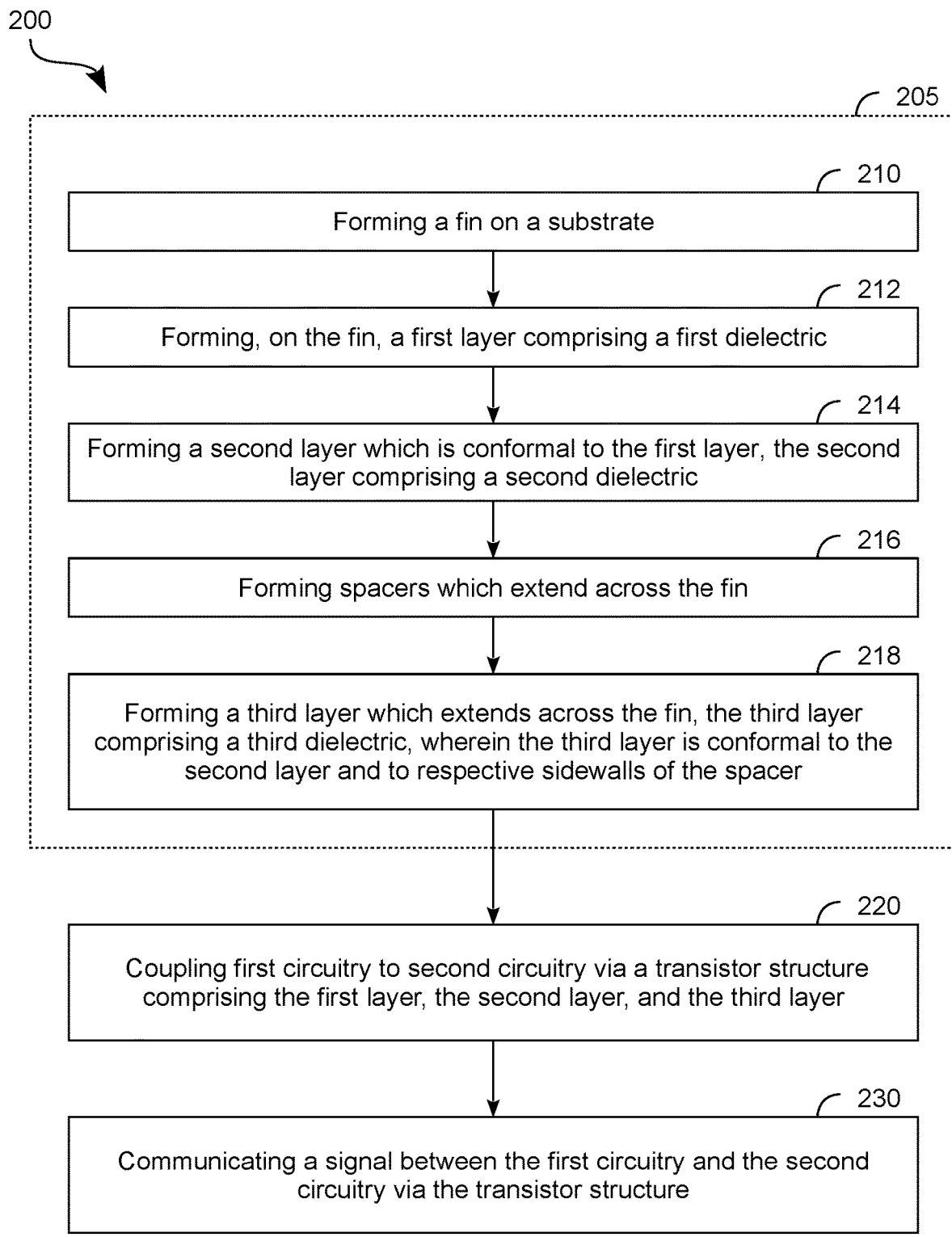
FIG. 2 illustrates a flow diagram illustrating elements of a method to fabricate structures of a non-planar semiconductor device according to an embodiment.

FIG. 2 shows features of a method 200, according to an embodiment, to provide functionality of an IC device (e.g., configured to provide transistor functionality) which includes a multiple dielectric structures variously extending under a gate structure and over a semiconductor fin structure. Method 200 is an example of processes to fabricate, interconnect and/or operate structures such as those of IC device 100, for example. To illustrate certain features of various embodiments, method 200 is described herein with reference to structures shown in FIGS. 3A through 3C. However, any of a variety of additional or alternative structures may be fabricated according to method 200, in different embodiments.

As shown in FIG. 2, method 200 comprises (for example) operations 205 to fabricate an IC structure at least in part. Such operations 205 include, for example, forming a channel region (i.e., a region which is to function as a channel during operation of the IC structure), forming a first layer comprising a first dielectric, forming on the first layer a second layer which comprises a second dielectric, and forming on the second layer a third layer which comprises a third dielectric. In some embodiment, one or more additional dielectric layers are formed to variously extend over the channel region.

Figure 3A:
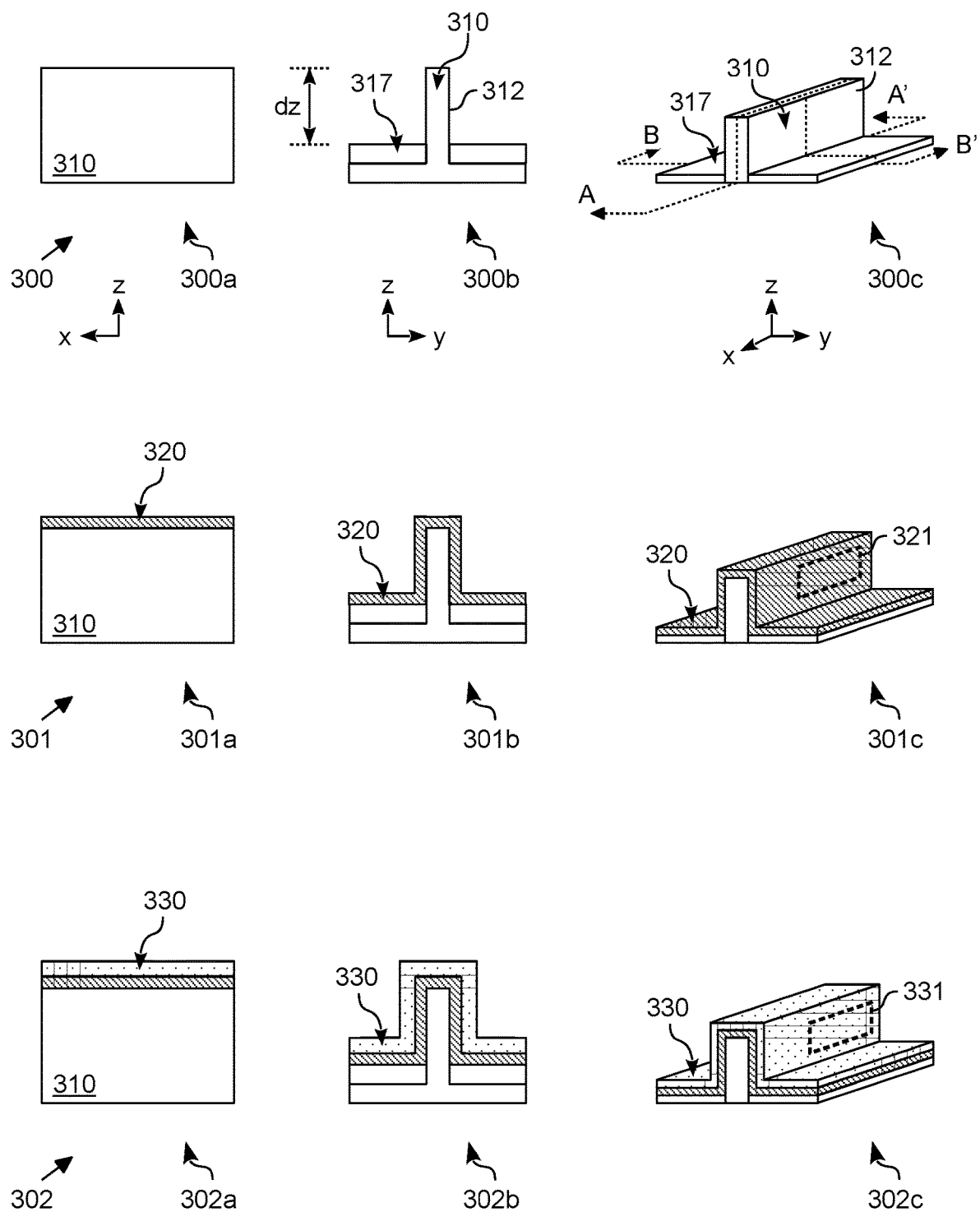
FIGS. 3A through 3C show various perspective and cross-sectional views each of a respective stage of processing to fabricate structures of a non-planar semiconductor device according to an embodiment.
Figure 3B:
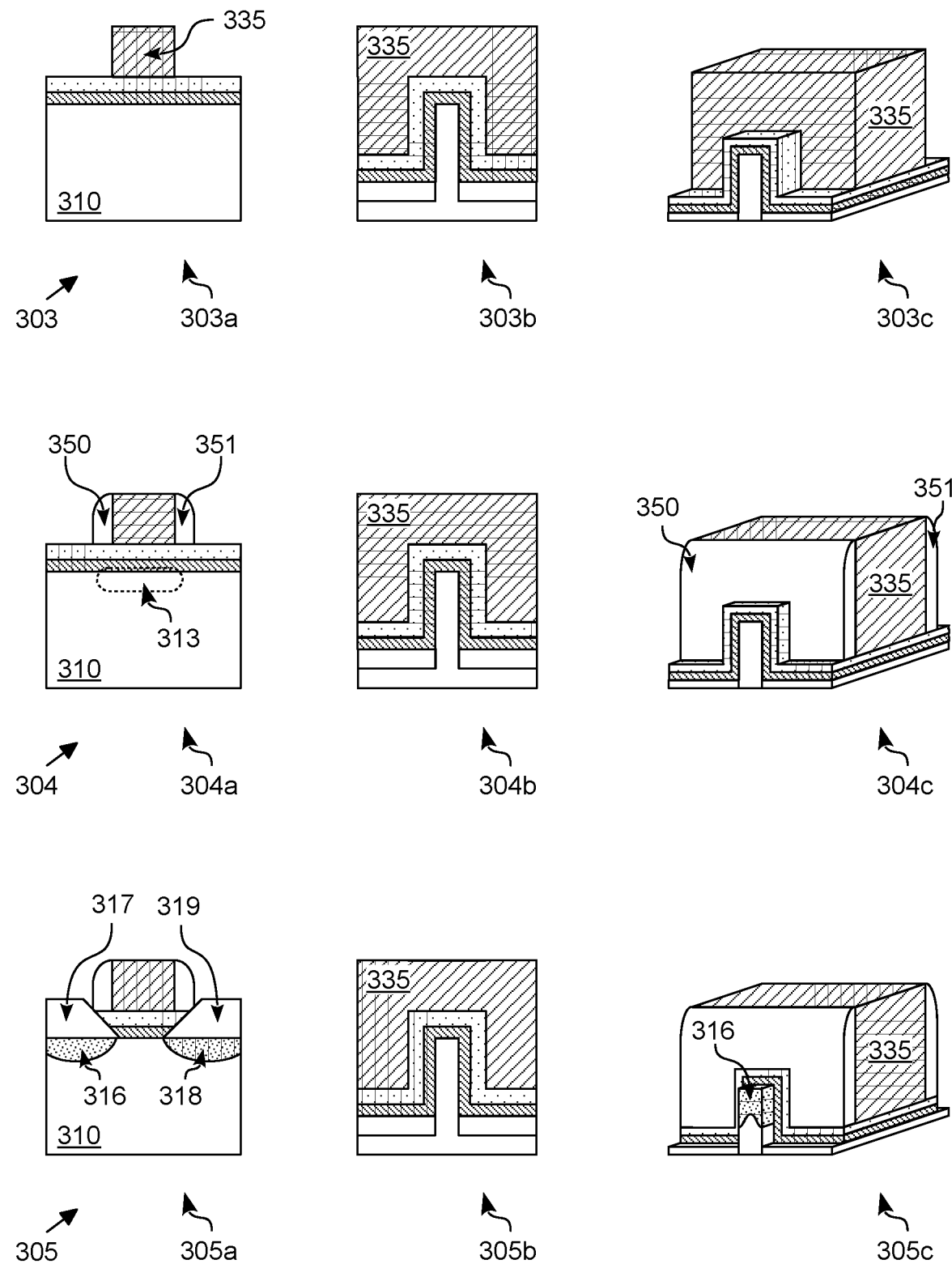
Figure 3C:
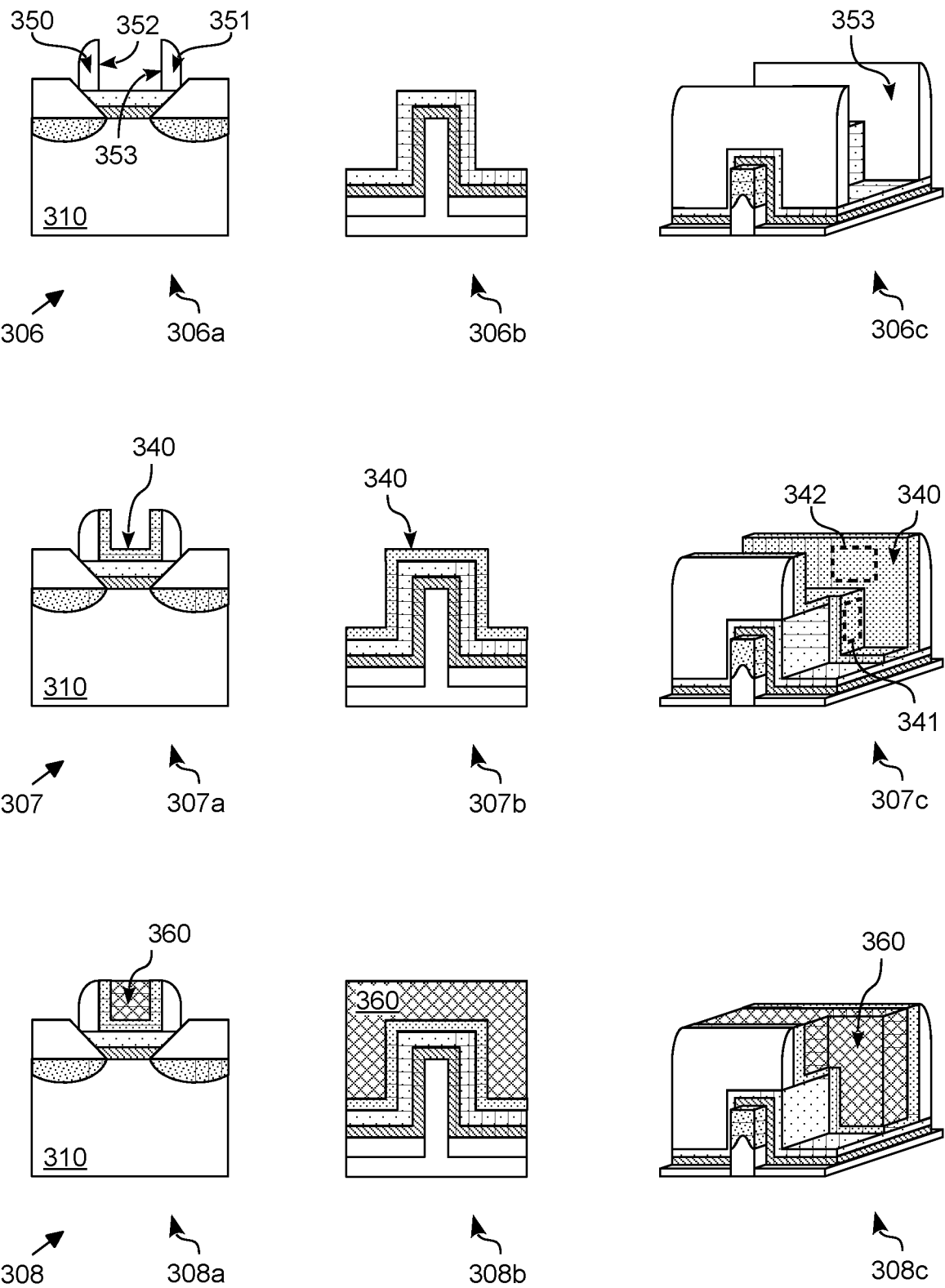

By way of illustration and not limitation, operations 205 comprise (at 210) forming a fin structure on a substrate, wherein the fin structure comprises a semiconductor material. Referring now to FIGS. 3A through 3C, cross-sectional views are shown for respective stages 300-308 of processing to fabricate a transistor structure according to an embodiment. For each of stages 300-308, FIGS. 3A-3C show respective median (y-z plane) cross-sectional views 300a-308a, respective transverse (x-z plane) cross-sectional views 300b-308b, and respective perspective views 300c-308c. The views 300a-308a correspond to a cross-section A-A' which extends in a mid-line x-z plane through a fin structure 310 (such as fin structure 110). The views 300b-308b correspond to a cross-section B-B' which extends in a y-z plane through a channel region of fin structure 310.

As shown at stage 300, a fin structure (such as the illustrative fin 310 shown) extends through a trench which is formed at least in part by a trench dielectric 317. Fin 310 includes some or all of the features of fin structure 110, for example. In an embodiment, fin 310 comprises one or more semiconductor materials and forms side surfaces including, for example, the illustrative side 312 shown. Side 312 has a vertical (z-axis) span which extends at least between a top of fin 310 and a horizontal surface, such as that of trench dielectric 317. In an example embodiment, such a vertical span is in a range of 10 nm to 200 nm. However, such dimensions may vary according to implementation-specific details, in different embodiments. The formation of fin 310 and trench dielectric 317 include operations that are adapted, for example, from conventional techniques for fabricating finFET transistors.

Referring again to FIG. 2, operations 205 further comprise (at 212) forming on the fin structure a first layer which comprises a first dielectric material. At least a portion of the first layer is serve as a structure to promote electrical insulation in a transistor structure which is to be fabricated with operations 205. In some embodiments, an average thickness of the first layer is equal to or less than 40 Angstroms (Å) thick—e.g., in a range of 5 Å to 40 Å and, in some embodiments, in a range of 5 Å to 20 Å. However, such dimensions may vary according to implementation-specific details, in different embodiments. In an embodiment, formation of the first layer at 212 includes any of a variety of additive processes (such as chemical vapor deposition, atomic layer deposition or the like) adapted, for example, from conventional semiconductor fabrication techniques.

Referring now to FIG. 3A, at stage 301, a layer 320 is formed (e.g., at 212) to extend—e.g., along the y-axis dimension shown—across and over at least a portion of fin 310. Layer 320 provides features and functionality of layer 120, for example. At least a portion of layer 320—e.g., a portion which is adjacent to, and conformal with, some of fin 310—is to provide at least part of a gate dielectric structure. By way of illustration and not limitation, the first dielectric material comprises silicon and one of oxygen, nitrogen, or carbon—e.g., wherein the first dielectric material is one of silicon oxides ($SiO_2$), silicon oxynitrides (SiON), silicon nitrides (SiN), silicon carbonitrides (SiCN), carbon-doped oxide (SiOC), or combinations thereof. However, in other embodiments, layer 320 includes any of a variety of suitable materials that are adapted from convention techniques for providing electrical insulation for non-planar transistors.

Referring again to FIG. 2, operations 205 further comprise (at 214) forming a second layer, at least a portion of which is conformal to—and, for example, adjacent to—the first layer, wherein the second layer comprises a second dielectric material. Similar to the forming at 212, any of a variety of additive processes (such as chemical vapor deposition, atomic layer deposition or the like) are adapted, in some embodiments, to form the second layer at 214.

Referring again to FIG. 3A, at stage 302, a layer 330 is formed (e.g., at 214) to extend—e.g., along the y-axis dimension shown—across and over at least a portion of layer 320 which itself extends across fin 310. Layer 330 provides features and functionality of layer 130, for example. At least some of layer 330 is adjacent to, and conformal with, a portion of fin 310, and is to supplement electrical insulation which is to be provided by that adjoining portion of fin 310. For example, formation of layer 330 comprises deposition of a second dielectric material that, in some embodiments, is of a dielectric constant which is greater than that of the first dielectric material. By way of illustration and not limitation, the second dielectric material comprises oxygen and a metal which, for example, includes, but is not limited to, one or more of aluminum (Al), tantalum (Ta), hafnium (Hf), zirconium (Zr), lanthanum (La), or titanium (Ti). For example, in some embodiments, the second dielectric material includes hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. However, in other embodiments, layer 330 includes any of a variety of suitable dielectric materials used in conventional non-planar transistors. Chemical vapor deposition and/or any of various other suitable techniques may be adapted to form one or both of layer 320, 330, in some embodiments.

In various embodiments, a thickness of layer 320 is in a range of 5 Å to 40 Å (e.g., in a range of 5 Å to 20 Å). For example, a portion 321 of layer 320 extends across at least a middle portion of the vertical span of side 312, where an average minimum thickness of portion 321 is in a range of 5 Å to 20 Å. Alternatively or in addition, a thickness of layer 330 is in a range of 5 Å to 40 Å (e.g., in a range of 5 Å to 20 Å). For example, a portion 331 of layer 330 extends across the adjoining portion 321, where an average minimum thickness of portion 331 is in a range of 5 Å to 20 Å. However, some embodiments are not limited to such thickness dimensions, which vary according to implementation-specific details.

Referring again to FIG. 2, operations 205 further comprise (at 216) forming spacers which extend across the fin. Such spacers include some or all of the features of insulation spacers 150, 151, for example. In an embodiment, forming the spacers at 216 includes, or is otherwise based on, a formation of one or more dummy (i.e., sacrificial) structures which are to confine at least in part the extent of such spacers. For example, referring now to FIG. 3B, stage 303 illustrates formation of a dummy gate 335. A portion of fin 310 which is under dummy gate 335 is to provide a channel region 313 of a transistor structure (or other such IC device) which is fabricated with operations 205.

Dummy gate 335 includes a layer of material such as polysilicon (e.g., doped, undoped, amorphous, crystalline or the like), or any of various suitable carbon based materials, for example. In an example embodiment, formation of dummy gate 335 includes forming a patterned resist mask (not shown) on layer 330 and depositing a dummy gate material through the patterned resist mask. Any of a variety of known mask, patterning, deposition and/or etch methods and techniques can be used to form dummy gate 335, in various embodiments.

In some embodiments, a bottom portion of dummy gate 335 includes, or is disposed on, a layer of a dummy gate dielectric material (not shown) which is deposited on layer 330. Such a dummy gate dielectric layer includes, for example, a layer of material such as but not limited to silicon dioxide or silicon carbide. Other embodiments omit any such dummy gate dielectric layer between layer 330 and dummy gate 335.

Subsequently, as shown at stage 304, one or both of spacer portions 350, 351 are formed—e.g., each at a respective one of two opposite sidewalls of dummy gate 335. Spacers 350, 351 are formed, for example, by blanket depositing (and subsequent etching) of a conformal dielectric film, such as, but not limited to, silicon nitride (SiN), silicon oxide (SiO), silicon oxycarbide (SiCO), silicon carbon oxynitride (SiCON), silicon carbonitride (SiCN), silicon oxynitride (SiON), or combinations thereof. A dielectric material of spacers 350, 351 may be deposited in a conformal manner so that the dielectric film forms to substantially equal heights on vertical surfaces, such as the sidewalls of dummy gate 335. In one exemplary embodiment, the dielectric film is a silicon nitride film formed by a hot-wall low-pressure chemical vapor deposition (LPCVD) process, by atomic layer deposition process (ALD), or the like. The deposited thickness of the dielectric film may determine the width or thickness of the formed spacers 350, 351. In an embodiment, the thickness of one of spacers 350, 351 may facilitate insulation of a later-formed gate electrode (not shown) during subsequent doping processes.

In some embodiments, processing such as that illustrated by stages 300-308 (e.g., including operations 205) comprises additional fabrication to form various other transistor structures while dummy gate 335 is disposed over channel region 313. As illustrated at stage 306, such additional fabrication comprises, for example, forming doped source or drain regions 316, 318 in portions of fin 310 which are on opposite respective sides of channel region 313. Other transistor structures formed by the additional fabrication include, for example, raised epitaxial (epi) source or drain regions 317, 319 (not shown in views 305c, 306c, 307c, 308c)—e.g., each extending over a respective one of the doped source or drain regions 316, 318—source or drain contact structures (not shown), and/or the like. Such additional fabrication includes processes that, for example, are adapted from conventional mask, patterning, etching, deposition, doping, polishing, and/or other techniques. In some embodiments, dummy gate 335 is etched or otherwise removed after such additional fabrication—e.g., as also illustrated at stage 306. Removal of dummy gate 335 exposes respective side surfaces 352, 353 of spacers 350, 351. In some embodiments, etching to remove dummy gate 335 also removes a dummy oxide (if any) which was previously deposited on layer 330. In various ones of such embodiments, a residue of the sacrificial oxide remains on the second layer 330 in a region under one or both of the spacers 350, 351.

Referring again to FIG. 2, operations 205 further comprise (at 218) forming a third layer which extends across the fin, wherein the third layer comprises a third dielectric material. The third layer is conformal to at least a portion of the second layer which extends across the fin, and is also conformal to respective sidewall structures of the spacers. For example, referring now to FIG. 3C, at stage 307, a layer 340 is formed (e.g., at 218) to extend across and over fin 310 in a region between spacers 350, 351—e.g., where layer 340 is adjacent and conformal to sides 352, 353. In various embodiments, layer 340 is also adjacent and conformal to that portion of layer 330 which itself extends across fin 310. To illustrate the relative configuration of various structures at stage 307, spacer 350 and the third layer 341 are each shown in partial cutaway in perspective view 307c.

Layer 340 provides features and functionality of layer 140, for example. At least some of layer 340 supplements electrical insulation which is to be provided with portions of layers 320, 330. For example, formation of layer 340 comprises deposition of a third dielectric material that, in some embodiments, is of the same or higher dielectric constant than that of the second dielectric material. By way of illustration, the third dielectric material comprises oxygen and a metal which, for example, includes, but is not limited to, one or more of aluminum (Al), tantalum (Ta), hafnium (Hf), zirconium (Zr), lanthanum (La), or titanium (Ti). For example, in some embodiments, the second dielectric material includes hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof.

In various embodiments, a thickness of layer 340 is equal to or less than 50 Å—e.g., in a range of 5 Å to 40 Å and, in some embodiments, in a range of 5 Å to 20 Å. For example, a portion 341 of layer 340 extends across portion 331, and a portion 342 of layer 340 extends across side surface 353. In one such embodiment, an average minimum thickness of portion 341 and/or average minimum thickness of portion 342 is in a range of 5 Å to 20 Å. However, some embodiments are not limited to such thickness dimensions, which vary according to implementation-specific details.

In some embodiments, fabrication of one or more of layers 320, 330, 340, and/or spacers 350, 351 comprises one or more operations which, for example, are adapted from conventional semiconductor fabrication techniques—e.g., including mask, lithography, deposition (e.g., chemical vapor deposition), etching and/or other processes. Some of these conventional techniques are not detailed herein to avoid obscuring certain features of various embodiments.

In some embodiments, method 205 further comprises operations (not shown) to fabricate other features of a transistor structure which is to include at least respective portions of the first layer, second layer and third layer. For example, as shown at stage 308, such additional processes may include forming a gate electrode structure 360 on layer 340—e.g., using operations adapted from conventional metallization and/or other deposition techniques. The particular shape and size of gate electrode structure 360 is merely illustrative, and not limiting on some embodiments. To illustrate the relative configuration of various structures at stage 308, spacer 350, the third layer 341, and gate electrode structure 360 are each shown in partial cutaway in perspective view 308c.

Although stage 308 shows that respective remaining portions of layers 320, 330, 340 variously extend each between channel region 313 and gate electrode structure 360, some embodiments provide one or more additional dielectric layers. For example, in other embodiments, structures at stage 308 further comprise one or more additional dielectric layers disposed between remaining portions of layers 320, 330. Alternatively or in addition, such additional structure comprise (for example) one or more additional dielectric layers which are conformal to a remaining portion of layer 330, and which are disposed between gate electrode structure 360 and the remaining portion of layer 330.

In various embodiments, fabrication processes expose some or all of layers 320, 330, 340 to high temperature and/or other conditions which cause comingling of different layers' dielectric materials. For example, a single structure is formed, in some embodiments, by such merging or other comingling of layers 320, 330. Such a single structure extends conformally over fin 310, the structure comprising a first dielectric material (from layer 320) at a first side which adjoins fin 310, and a second dielectric material (from layer 330) at a second side opposite the first side, wherein the first dielectric material is of a first dielectric constant which is greater than a second dielectric constant of the second dielectric material.

In some embodiments, method 200 additionally or alternatively includes operations to connect and/or operate an integrated circuit such as that which is produced by operations 205. For example, method 200 may comprise (at 220) coupling first circuitry to second circuitry via a transistor structure comprising the first layer, the second layer and the third layer. Alternatively or in addition, method 200 may comprise (at 230) communicating a signal between the first circuitry and the second circuitry via the transistor structure.

Figure 4A:
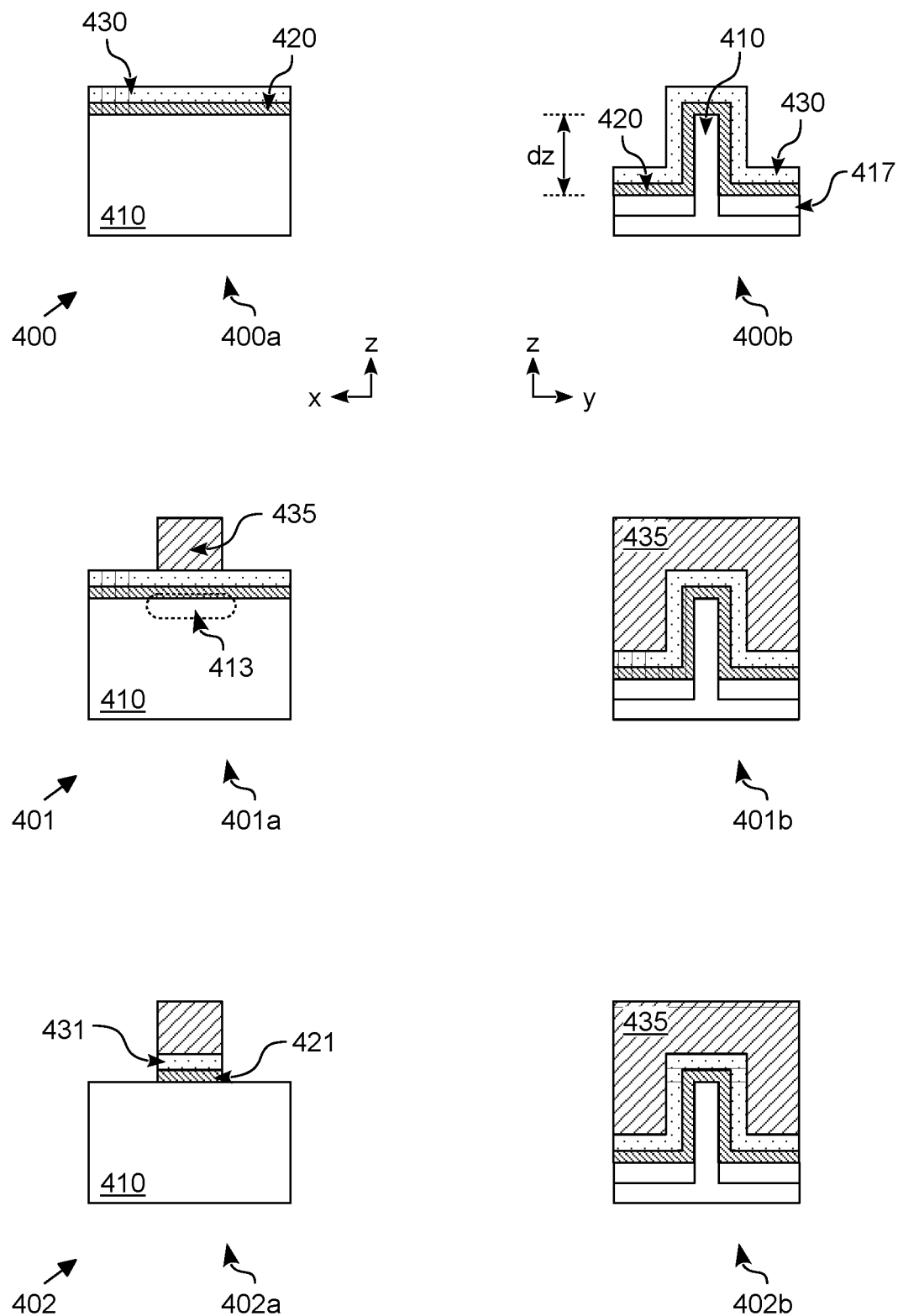
FIGS. 4A through 4C show various perspective and cross-sectional views each of a respective stage of processing to fabricate structures of a non-planar semiconductor device according to an embodiment.
Figure 4B:
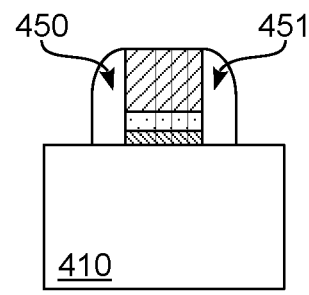
Figure 4B:
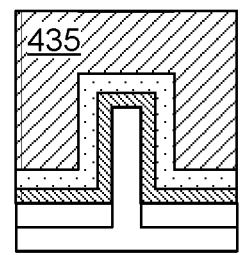
Figure 4B:
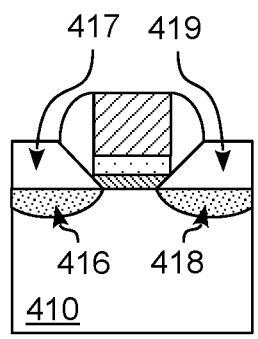
Figure 4B:
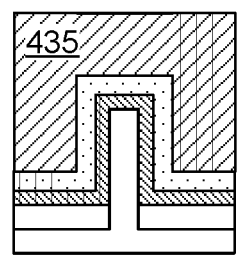
Figure 4B:
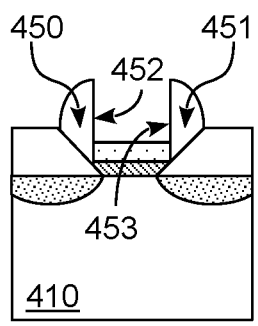
Figure 4B:
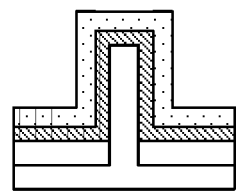
Figure 4C:
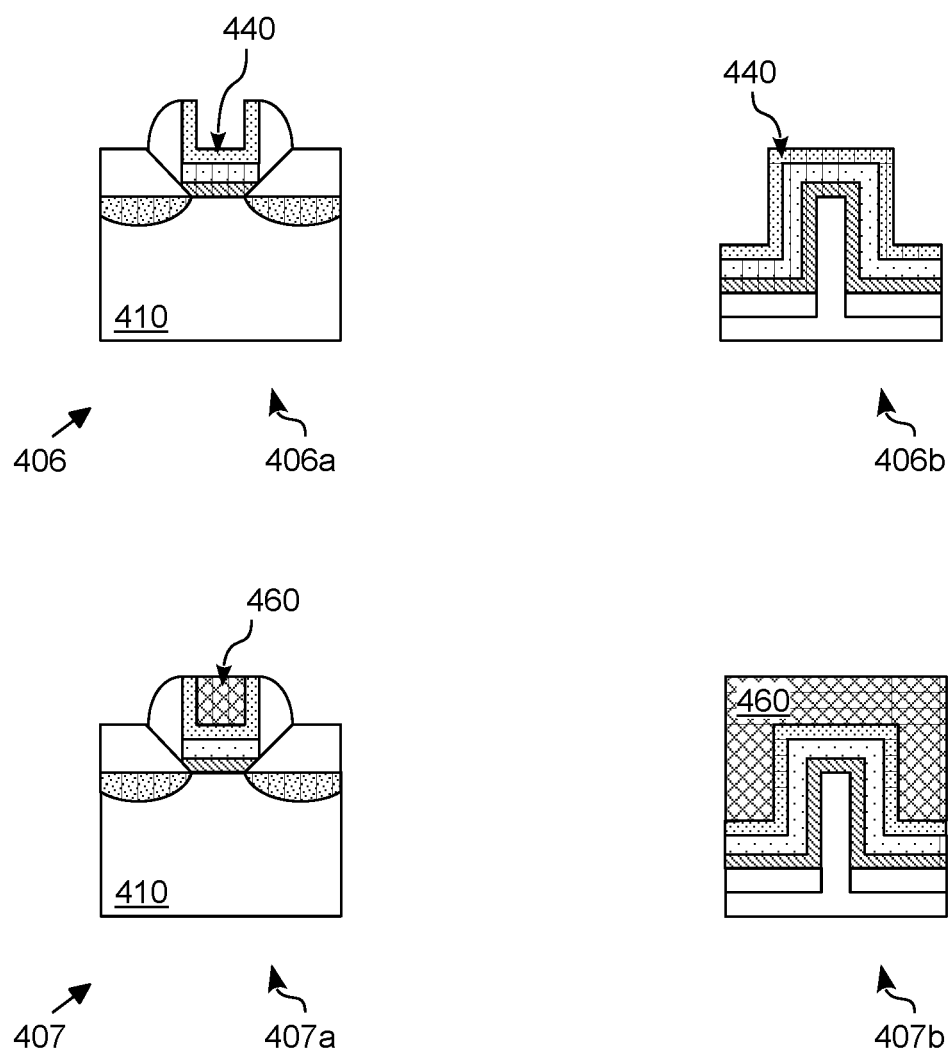

FIGS. 4A-4C show cross-sectional views for respective stages 400-407 of processing to fabricate a transistor structure according to another embodiment. For each of stages 400-407, FIGS. 4A-4C show respective median (y-z plane) cross-sectional views 400a-407a, and respective transverse (x-z plane) cross-sectional views 400b-407b. In some embodiments, the processing illustrated by stages 400-407 is to fabricate structures such as those of IC device 100—e.g., wherein such processing includes some or all of operations 205.

In the example embodiment shown, structures formed at stage 400 are similar to those formed at stage 302—e.g., wherein layers 420, 430 of a first dielectric material and a second dielectric material (respectively) variously extend over and across a fin structure 410 which extends along a vertical span dz from a trench dielectric 317. Layers 420, 430 provide the respective features and functionality of layers 120, 130 (respectively), for example.

Stage 401 illustrates formation of a dummy gate 435. A portion of fin 410 which is under dummy gate 435 is to provide a channel region 413 of a transistor structure (or other suitable non-planar IC device). Dummy gate 435 includes some or all of the features of dummy gate 335, for example. In some embodiments, a bottom portion of dummy gate 435 includes, or is disposed on, a layer of a dummy gate dielectric material (not shown) which is deposited on layer 430. However, other embodiments omit any such dummy gate dielectric layer between layer 430 and dummy gate 435.

At stage 402, etching and/or other subtractive processing is performed—e.g., with a patterned mask (not shown) to remove respective portions of layers 420, 430 which are not under dummy gate 435. Such subtractive processing leaves respective portions 421, 431 of layers 420, 430, in some embodiments. Subsequently, as shown at stage 403, spacer portions 450, 451 are formed—e.g., each at a respective one of two opposite sidewalls of dummy gate 435. Spacers 450, 451 include features of insulation spacers 150, 151 or spacers 350, 351, except where (for example) portions 421, 431 abut against, and do not extend under, spacer portions 450, 451.

In some embodiments, processing such as that illustrated by stages 400-407 comprises additional fabrication to form various other transistor structures while dummy gate 435 is disposed over channel region 413. As illustrated at stage 404, such additional fabrication comprises, for example, forming doped source or drain regions 416, 418 in portions of fin 410 which are on opposite respective sides of channel region 413. Other transistor structures formed by the additional fabrication include, for example, raised epitaxial (epi) source or drain regions 417, 419—each extending over a respective one of the doped source or drain regions 316, 318—source or drain contact structures (not shown), and/or the like. Such additional fabrication includes processes that, for example, are adapted from conventional mask, patterning, etching, deposition, doping, polishing, and/or other techniques. In some embodiments, dummy gate 435 is etched or otherwise removed after such additional fabrication—e.g., as also illustrated at stage 405. Removal of dummy gate 435 exposes respective side surfaces 452, 453 of spacers 450, 451. In some embodiments, etching to remove dummy gate 435 also removes a dummy oxide (if any) which was previously deposited on layer 430.

Referring now to FIG. 4C, at stage 406, a layer 440 is formed (e.g., at 218) to extend across and over fin 410 in a region between spacers 450, 451—e.g., where layer 440 is adjacent and conformal to sides 452, 453. In various embodiments, layer 440 is also adjacent and conformal to that portion of layer 430 which itself extends across fin 410. Layer 440 provides features and functionality of layer 140, in some embodiments. Of the layer portions 421, 431 and layer 440, the layer 440 (e.g., only layer 440) extends conformally along the respective side surfaces 452, 453 of spacers 450, 451.

In some embodiments, fabrication of one or more of layers 420, 430, 440, and/or spacers 450, 451 comprises one or more operations which, for example, are adapted from conventional semiconductor fabrication techniques—e.g., including mask, lithography, deposition (e.g., chemical vapor deposition), etching and/or other processes. Some of these conventional techniques are not detailed herein to avoid obscuring certain features of various embodiments. As shown at stage 407, subsequent processing includes, for example, forming a gate electrode structure 460 on layer 440—e.g., using operations adapted from conventional metallization and/or other deposition techniques.

Figure 5:
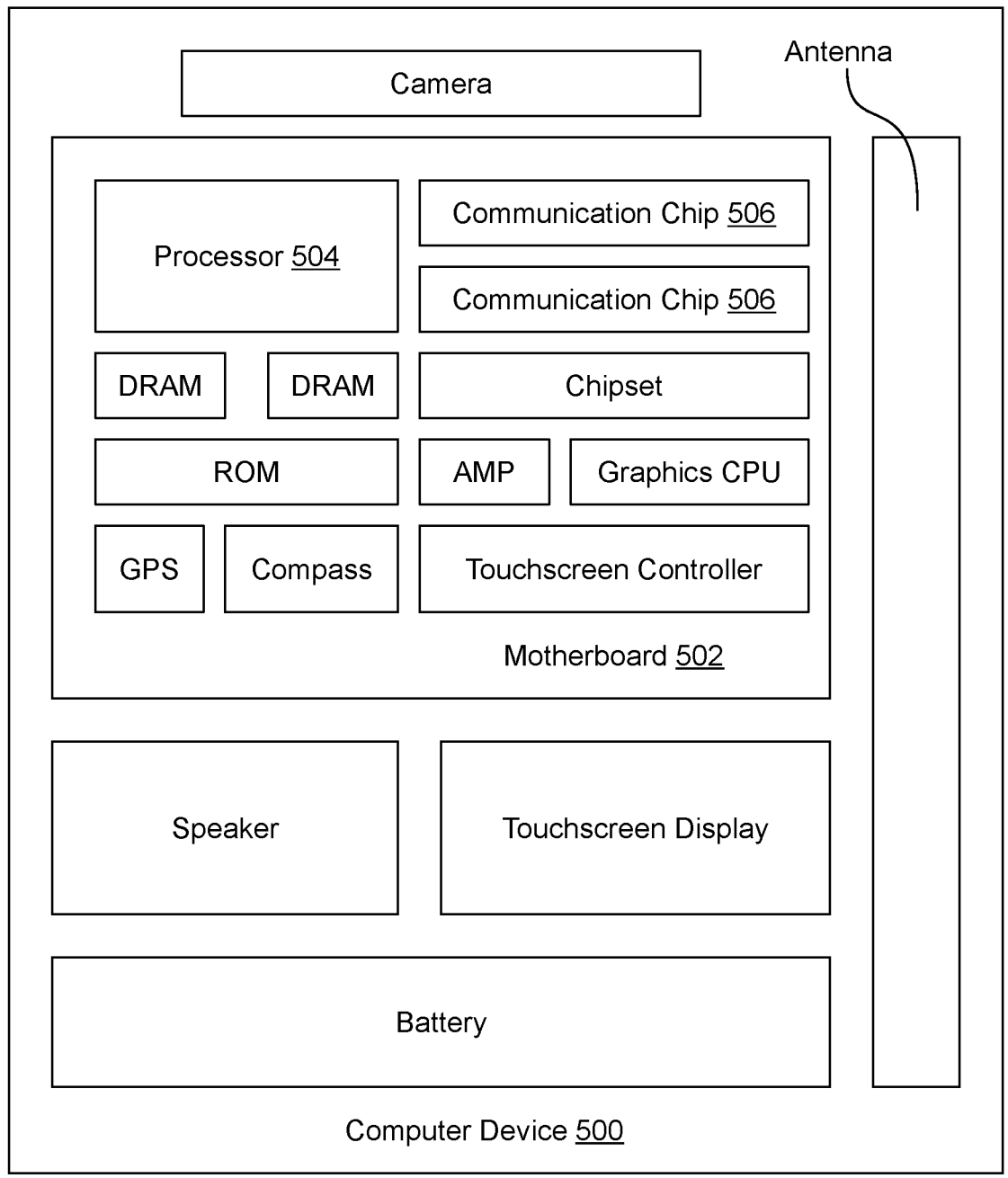
FIG. 5 illustrates a functional block diagram illustrating a computing device in accordance with one embodiment.

FIG. 5 illustrates a computing device 500 in accordance with one embodiment. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. The term "processor" may refer to any device or portion of a device that processes electronic data from registers and/or memory to transform that electronic data into other electronic data that may be stored in registers and/or memory. The communication chip 506 also includes an integrated circuit die packaged within the communication chip 506.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
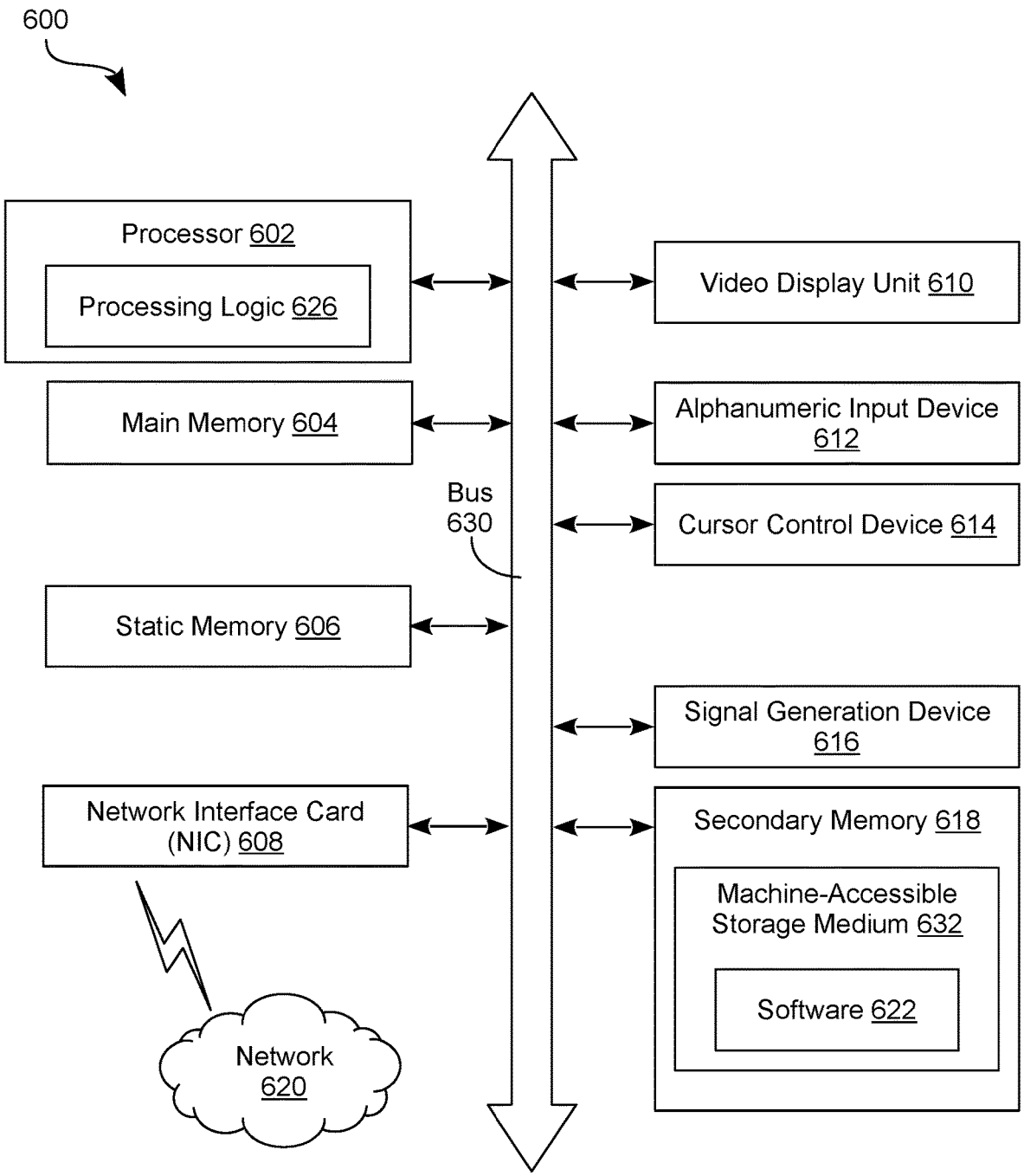
FIG. 6 illustrates a functional block diagram illustrating an exemplary computer system, in accordance with one embodiment.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Techniques and architectures for providing insulation at a non-planar integrated circuit device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) device comprising:
   a fin structure comprising source or drain regions of a transistor, and a channel region of the transistor, the channel region between the source or drain regions;
   spacers which each extend over a respective one of the source or drain regions, the spacers each comprising a respective one of first sidewalls which face each other;
   a first layer of a first dielectric material which adjoins the channel region, wherein, in a first plane, the first layer extends conformally over a top surface of the fin structure and along second sidewalls of the fin structure, wherein, in a second plane which is orthogonal to the first plane, the first layer extends over the channel region, wherein first portions of the first layer are each between the fin structure and a different respective one of the spacers;
   a second layer of a second dielectric material which adjoins the spacers, wherein, in the first plane, the second layer extends over the fin structure and along third sidewalls of the first layer, and wherein, in the second plane, second portions of the second layer are each between the fin structure and a different respective one of the first portions; and
   a third layer of a third dielectric material which adjoins the second layer in an area over the channel region, wherein, in the second plane, the third layer spans the area and both extends conformally along, and adjoins, the first sidewalls.

2. The IC device of claim 1, wherein the first dielectric material is of a first dielectric constant, wherein the second dielectric material is of a second dielectric constant, and wherein the first dielectric constant is less than the second dielectric constant.

3. The IC device of claim 2, wherein the third dielectric material is of a third dielectric constant, and wherein the second dielectric constant is equal to or less than the third dielectric constant.

4. The IC device of claim 1, wherein the second layer or the third layer comprises oxygen and one of aluminum (Al), tantalum (Ta), hafnium (Hf), zirconium (Zr), lanthanum (La), or titanium (Ti).

5. The IC device of claim 1, wherein the second layer extends under one of the spacers.

6. The IC device of claim 5, wherein the first layer extends under one of the spacers.

7. The IC device of claim 1, wherein each of the first layer and the second layer abuts to a sidewall of the spacers.

8. The IC device of claim 1, wherein a residue of a sacrificial oxide is disposed between the second layer and one of the spacers.

9. The IC device of claim 1, wherein an average thickness of the first layer is in a range of 5 Angstroms (Å) to 40 Å.

10. An integrated circuit (IC) device comprising:
    a fin structure comprising source or drain regions of a transistor, and a channel region of the transistor, the channel region between the source or drain regions;
    spacers which each extend over a respective one of the source or drain regions, the spacers each comprising a respective one of first sidewalls which face each other;
    a first structure comprising a first dielectric material at a first side which adjoins the fin structure, and a second dielectric material at a second side opposite the first side, wherein the second side adjoins the spacers, wherein the first dielectric material is of a first dielectric constant which is greater than a second dielectric constant of the second dielectric material, wherein in a first plane, the first structure extends conformally over a top surface of the fin structure and along second sidewalls of the fin structure, wherein, in a second plane which is orthogonal to the first plane, the first structure extends over the channel region, and wherein first portions of the first structure are each between the fin structure and a different respective one of the spacers;
    a second structure comprising a third dielectric material which adjoins the first structure in an area over the channel region, wherein, in the second plane, the second structure spans the area and both extends conformally along, and adjoins, the first sidewalls.

11. The IC device of claim 10, wherein the third dielectric material is of a third dielectric constant, and wherein the second dielectric constant is equal to or less than the third dielectric constant.

12. The IC device of claim 10, wherein the second structure extends under one of the spacers.

13. The IC device of claim 10, wherein the first structure abuts to a sidewall of the spacers.

14. The IC device of claim 10, wherein a residue of a sacrificial oxide is disposed between the first structure and one of the spacers.

15. A system comprising:
    an integrated circuit (IC) device comprising:
        a transistor comprising:
            a fin structure comprising source or drain regions, and a channel region between the source or drain regions;
            spacers which each extend over the fin structure, the spacers each comprising a respective one of first sidewalls which face each other;
            a first layer of a first dielectric material which adjoins the channel region, wherein, in a first plane, the first layer extends conformally over a top surface of the fin structure and along second sidewalls of the fin structure, wherein, in a second plane which is orthogonal to the first plane, the first layer extends over the channel region, wherein first portions of the first layer are each between the fin structure and a different respective one of the spacers;
            a second layer of a second dielectric material which adjoins the spacers, wherein, in the first plane, the second layer extends over the fin structure and along third sidewalls of the first layer, and wherein, in the second plane, second portions of the second layer are each between the fin structure and a different respective one of the first portions; and
            a third layer of a third dielectric material which adjoins the second layer in an area over the channel region, wherein, in the second plane, the third layer spans the area and both extends conformally along, and adjoins, the first sidewalls; and
    a display device coupled to the IC device, the display device to display an image based on a signal to be communicated with the transistor.

16. The system of claim 15, wherein the first dielectric material is of a first dielectric constant, wherein the second dielectric material is of a second dielectric constant, and wherein the first dielectric constant is less than the second dielectric constant.

17. The system of claim 16, wherein the third dielectric material is of a third dielectric constant, and wherein the second dielectric constant is equal to or less than the third dielectric constant.

18. The system of claim 15, wherein the second layer extends under one of the spacers.

19. The system of claim 15, wherein each of the first layer and the second layer abuts to a sidewall of the spacers.

20. The system of claim 15, wherein a residue of a sacrificial oxide is disposed between the second layer and one of the spacers.

* * * * *